(12) United States Patent
Greif-Wuestenbecker et al.

(10) Patent No.: US 7,961,297 B2
(45) Date of Patent: Jun. 14, 2011

(54) METHOD FOR DETERMINING INTENSITY DISTRIBUTION IN THE IMAGE PLANE OF A PROJECTION EXPOSURE ARRANGEMENT

(75) Inventors: Joern Greif-Wuestenbecker, Vienna (AT); Beate Boehme, Grosspuerschuetz (DE); Ulrich Stroessner, Jena (DE); Michael Totzeck, Schwaebisch Gmuend (DE); Vladimir Kamenov, Essingen (DE); Olaf Dittmann, Bopfingen (DE); Daniel Kraehmer, Essingen (DE); Toralf Gruner, Aalen-Hofen (DE); Bernd Geh, Scottsdale, AZ (US)

(73) Assignee: Carl Zeiss SMS GmbH, Jena (DE)

( * ) Notice: Subject to any disclaimer, the term of this patent is extended or adjusted under 35 U.S.C. 154(b) by 571 days.

(21) Appl. No.: 12/065,451

(22) PCT Filed: Sep. 2, 2006

(86) PCT No.: PCT/EP2006/008581
§ 371 (c)(1),
(2), (4) Date: Feb. 29, 2008

(87) PCT Pub. No.: WO2007/028553
PCT Pub. Date: Mar. 15, 2007

(65) Prior Publication Data
US 2008/0212060 A1    Sep. 4, 2008

(30) Foreign Application Priority Data

Sep. 5, 2005 (DE) .................... 10 2005 042 496

(51) Int. Cl.
G03B 27/72 (2006.01)
G03B 27/32 (2006.01)
G03B 27/68 (2006.01)
G03B 27/42 (2006.01)
G03B 27/54 (2006.01)

(52) U.S. Cl. ............... 355/71; 355/52; 355/53; 355/67; 355/77

(58) Field of Classification Search .............. 355/52, 355/53, 55, 67–71, 77; 430/5, 30, 311; 716/19, 716/20, 21
See application file for complete search history.

(56) References Cited

U.S. PATENT DOCUMENTS

| | | | | |
|---|---|---|---|---|
| 4,806,885 A | * | 2/1989 | Morimoto | 359/284 |
| 5,331,468 A | * | 7/1994 | Noethen | 359/738 |
| 5,861,866 A | * | 1/1999 | Inoue et al. | 345/643 |
| 5,925,887 A | * | 7/1999 | Sakai et al. | 250/548 |

(Continued)

FOREIGN PATENT DOCUMENTS
DE    102 18 989 A1    11/2003
(Continued)

*Primary Examiner* — Peter B Kim
*Assistant Examiner* — Christina Riddle
(74) *Attorney, Agent, or Firm* — Patterson Thuente Christensen Pedersen, P.A.

(57) ABSTRACT

A method for determining intensity distribution in the focal plane of a projection exposure arrangement, in which a large aperture imaging system is emulated and a light from a sample is represented on a local resolution detector by an emulation imaging system. A device for carrying out the method and emulated devices are also described. The invention makes it possible to improve a reproduction quality since the system apodisation is taken into consideration. The inventive method includes determining the integrated amplitude distribution in an output pupil, combining the integrated amplitude distribution with a predetermined apodization correction and calculating a corrected apodization image according to the modified amplitude distribution.

25 Claims, 5 Drawing Sheets

U.S. PATENT DOCUMENTS

| | | | |
|---|---|---|---|
| 6,278,514 B1 * | 8/2001 | Ohsaki | 355/55 |
| 6,363,033 B1 * | 3/2002 | Cole et al. | 367/138 |
| 6,656,373 B1 * | 12/2003 | Neal et al. | 216/26 |
| 7,030,978 B2 | 4/2006 | Guetta et al. | |
| 7,133,119 B1 * | 11/2006 | Pettibone et al. | 355/71 |
| 7,199,922 B2 | 4/2007 | Mann et al. | |
| 7,224,430 B2 * | 5/2007 | Dierichs | 355/53 |
| 7,336,342 B2 | 2/2008 | Holderer et al. | |
| 2001/0007495 A1 | 7/2001 | Suzuki et al. | |
| 2002/0186879 A1 | 12/2002 | Hemar et al. | |
| 2003/0053036 A1 * | 3/2003 | Fujishima et al. | 355/53 |
| 2003/0215616 A1 * | 11/2003 | Pierrat | 428/195.1 |
| 2005/0015233 A1 | 1/2005 | Gordon | |
| 2005/0091013 A1 | 4/2005 | Gallatin et al. | |
| 2005/0168790 A1 | 8/2005 | Latypov et al. | |
| 2005/0225736 A1 * | 10/2005 | Yao et al. | 355/52 |
| 2006/0050260 A1 * | 3/2006 | Van De Kerkhof et al. | 355/69 |
| 2006/0091324 A1 * | 5/2006 | Marie Dierichs | 250/492.2 |
| 2006/0109436 A1 * | 5/2006 | Van Der Laan et al. | 355/52 |
| 2007/0082272 A1 | 4/2007 | Mann et al. | |
| 2007/0146672 A1 * | 6/2007 | Bleeker et al. | 355/67 |
| 2008/0184192 A1 * | 7/2008 | Zhang et al. | 716/21 |

FOREIGN PATENT DOCUMENTS

| | | |
|---|---|---|
| DE | 102 20 324 A1 | 11/2003 |
| EP | 0 628 806 A2 | 12/1994 |
| EP | 0 689 099 A1 | 12/1995 |
| EP | 1 081 489 A2 | 3/2001 |
| EP | 1 282 011 A2 | 2/2003 |
| WO | WO 03/092256 A2 | 11/2003 |
| WO | WO 2004/072627 A1 | 8/2004 |
| WO | WO 2005/036266 A1 | 4/2005 |

* cited by examiner

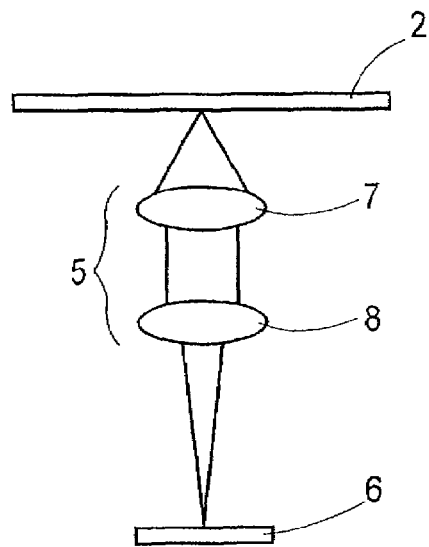
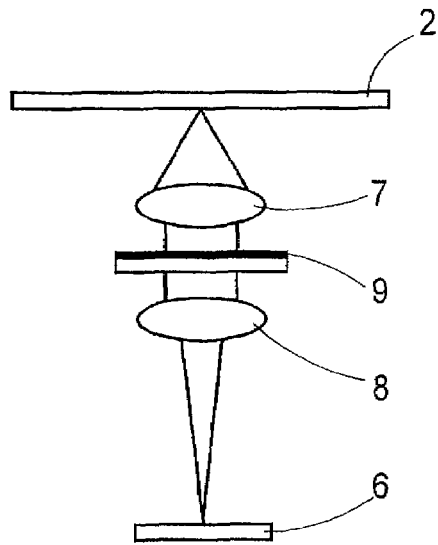
Fig.2  Fig.3a
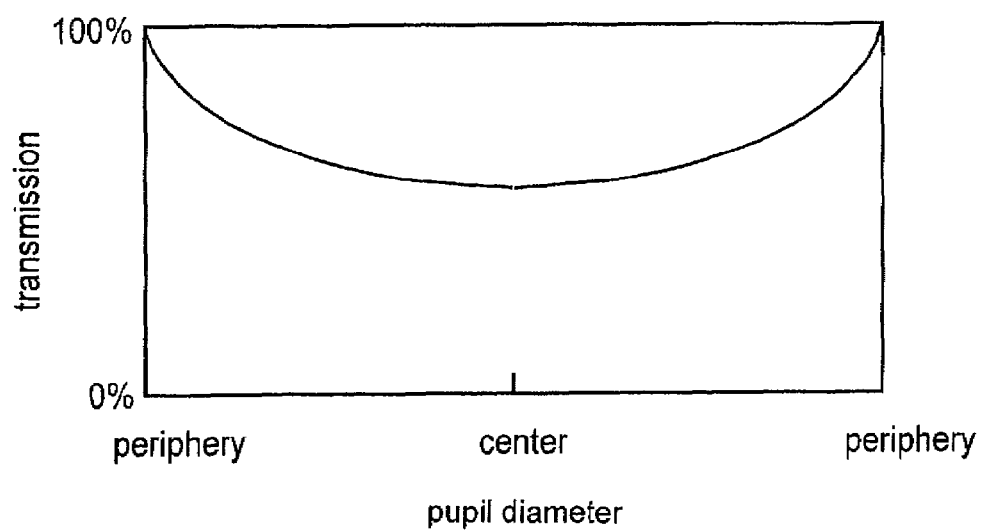
Fig.3b

METHOD FOR DETERMINING INTENSITY DISTRIBUTION IN THE IMAGE PLANE OF A PROJECTION EXPOSURE ARRANGEMENT

FIELD OF THE INVENTION

The invention relates to a method wherein an imaging system having a large aperture is emulated and light coming from a sample is imaged onto a spatially resolving detector by means of an emulation imaging system.

BACKGROUND OF THE INVENTION

In particular, the emulated imaging system may be a photolithographic scanner used to produce microelectronic circuits. For this purpose, photolithographic masks are used whose structures are imaged onto wafers coated with photoresist, such that the resist is exposed and the structure on the wafer is modified at the exposed locations.

Emulation imaging systems are used to emulate such a photolithographic scanner. However, whereas the scanner images a reduced-size image of the mask's structure onto the carrier to be exposed, an emulation imaging system is used in mask inspection systems, in which case an enlarged image of the structure is imaged onto a detector. While both systems have the same numerical aperture on the mask side, they differ on the image side. The image-side numerical aperture of a mask inspection system, on the one hand, is approximately 0. On the other hand, increasingly smaller object structure sizes require increasingly greater image-side numerical apertures of 0.8 and more in the photolithographic scanner. This leads to deviations in the images of the mask inspection system and of the photolithographic scanner, which are no longer negligible, particularly in cases where the ratio of the numerical aperture of the scanner to the refractive index in the photoresist is greater than 0.8/1.7. These deviations, or defects appearing in the scanner system, respectively, also include the so-called apodization. The transmission of light in the photoresist as a function of the angle of incidence is not constant, but increases towards great angles of incidence.

In the prior art, the image-side differences between the photolithographic scanner and the emulation imaging system for mask inspection only play a secondary role. However, in the semiconductor industry, the use of immersion systems for manufacturing wafer structures of less than 65 nm is favored for the future. By applying an immersion liquid onto the wafer, numerical apertures NA>1 are achieved on the image-side, allowing smaller structures to be generated at the same wavelength. Thus, for example, using water as the immersion liquid and illumination with light at a wavelength of $\lambda=193$ nm, a maximum numerical aperture of 1.4 can be achieved. Even greater numerical apertures can be achieved using other immersion liquids. A reduction factor of 1:4 requires mask structures of 260 nm or 180 nm, respectively, for wafer structures of 65 nm or 45 nm, respectively. Thus, the mask structures are within the range of the imaging wavelength of currently 193 nm. In the case of smaller structures, the analysis of defects in the masks to be used is becoming increasingly important. One example of a mask inspection system suitable for analysis is the AIMS™ (Areal Imaging Measurement System) of Carl Zeiss SMS GmbH. A small area of the mask (site of the defect) is illuminated and imaged under the same conditions of illumination and imaging (wavelength, numerical aperture) as in the photolithographic scanner. In contrast to the photolithographic scanner, however, the image generated by the mask is enlarged and imaged onto a CCD camera. The camera sees the same image as the photoresist on the wafer. Thus, the aerial image can be analyzed without complicated test prints. In this system—just like in the other systems known in the prior art—the deviation in apodization with respect to the photolithographic scanner is not taken into consideration, because the numerical apertures are still so small that the deviations have not played a role so far. However, since the use of larger apertures on the mask side in the photolithographic scanner may be expected in the future, these deviations are becoming more important.

SUMMARY OF THE INVENTION

Therefore, it is an object of the present invention to find ways in which the imaging conditions in terms of the apodization behavior between the mask inspection system, on the one hand, and the photolithographic scanner, on the other hand, are adjusted to each other.

In a method of the above-described type, this object is achieved in that a mask is illuminated, the light coming from the mask is directed onto a spatially resolving detector, a signal is recorded by the spatially resolving detector, and the intensity distribution is computed on the basis of the signal. Said computation takes the numerical aperture in the image plane of the projection illumination system into account.

In an advantageous embodiment of the invention, the phase distribution of the incident light is determined in the image plane. On the basis of said phase distribution, the complex amplitude distribution in the exit pupil is reconstructed, the reconstructed amplitude distribution is combined with a predetermined apodization correction, and the modified amplitude distribution is used to compute an image having a corrected apodization.

In a further advantageous embodiment of the invention, the complex amplitude distribution is determined by computing the phase distribution of the incident light in the image plane and reconstructing the complex amplitude distribution on the basis of the phase distribution.

Determining the phase distribution in the image plane allows computing by known methods, such as two-dimensional Fourier transformation or by phase retrieval, of which of the beams in the exit pupil, where the beams emanating from an object point are all parallel, leads to which point in the image plane. The phase itself can be measured by methods known from the prior art. For example, several images can be recorded in front of within and behind the focal plane, and then the phase values can be mathematically reconstructed by a recursive method of evaluation. Direct measurement of the phase values, for example by the Shack Hartmann method, is also possible. A phase-shifting lateral shearing interferometer can also be used to determine the phase distribution. Knowledge of the phase distribution allows the complex amplitude distribution in the exit pupil to be mathematically reconstructed. This reconstructed amplitude distribution is then combined with a predetermined apodization correction, which results in a modified amplitude distribution. The latter, in turn, finally allows computing of an image in which the correction of the apodization is taken into consideration.

In this case, the complex amplitude distribution is advantageously not determined for each point in the pupil plane, but only for a number of points having the coordinates (p,q). The amplitude distribution is combined with the apodization correction only for these points. Common interpolation methods can be used to compute the intermediate values.

Depending on the problem to be solved, the apodization correction can be predetermined in different ways. Thus, for example, the predetermined apodization correction may be an apodization which substantially corresponds to the apodization present in the emulation imaging system, and the amplitude distribution can be divided by this apodization. In this manner, the apodization present in the system can be compensated for at least in part. Conveniently, the predetermined apodization correction will be the natural apodization or, if known, the technical apodization, or both combined.

However, the predetermined apodization correction will preferably be an apodization which substantially corresponds to the apodization present in the emulated imaging system, and the amplitude distribution will be multiplied therewith. This allows the apodization present in the emulated imaging system to be generated at least approximately, so that the conditions prevailing there are emulated in the best possible way. The natural apodization or the technical apodization, or both apodizations present in the emulated imaging system are conveniently given here as the apodization correction as well. This is important, in particular, if the emulated imaging system is a photolithographic scanner, because this is precisely the manner in which the conditions prevailing in the photolithographic scanner can be emulated best. In order to emulate these conditions as faithfully as possible, it is advantageous to predetermine the apodization correction as a function of the scanner's numerical aperture and of the emulated photoresist. The apodization of the photolithographic scanner can then be emulated by multiplying the amplitude distribution in the exit pupil by the factor 1/cos θ', with θ' being the angle of incidence of the light in the emulated photoresist. The natural apodization T(p,q) of the photolithographic scanner can also be determined according to the term $$T(p, q) = \left( \frac{1}{1 - \left(\frac{p}{n'}\right)^2 - \left(\frac{q}{n'}\right)^2} \right)^{\frac{1}{4}}$$

wherein T is the amplitude transmission, n' is the refractive index of the photoresist used, and (p,q) are the dimension-less pupil coordinates.

Apart from the mathematical consideration of the apodization present in the scanner, the object is also achieved by a method of the above-described type in that, in order to modify the apodization, an intensity-modifying optical element is placed in or connected to the beam path. Using this element, a predetermined intensity distribution is then generated in the exit pupil. Said intensity-modifying optical element can be advantageously controlled to generate a predetermined intensity distribution. For example, this allows different apodizations caused by different photoresists to be taken into account in the photolithographic scanner. Another possibility consists in changing this intensity-modifying optical element, which change can be effected automatically. Conveniently, an intensity distribution substantially corresponding to the natural and/or technical apodization of the emulated imaging system will be given, so that said apodization will be generated at least approximately. In this case, the natural apodization is determined according to the term $$\sqrt{\frac{n\cos\theta}{n'\cos\theta'}}$$

wherein n and θ are the refractive index and the angle of incidence, respectively, of the light in the object space, i.e. in the mask; n' and θ' are the corresponding quantities in the image space, i.e. on the wafer, with n' and θ' referring to the photoresist.

In a further embodiment of the method, an intensity distribution substantially corresponding to the inverse natural and/or inverse technical apodization of the emulation imaging system is predetermined as an alternative or in addition, so that said apodization is compensated for at least in part. This allows elimination of the apodization effects of the emulation imaging system almost completely and thus emulates the apodization of the emulated imaging system in a substantially realistic manner.

As a rule, intensity-attenuating elements, such as filters, will be used to modify intensity. However, an embodiment of the method is also conceivable wherein intensity is enhanced by the intensity-modifying optical element.

If a photolithographic scanner is emulated, the intensity distribution will be advantageously predetermined as a function of the numerical aperture of the scanner and of the emulated photoresist.

Further, in microscopic imaging systems for carrying out the method according to some embodiments of the invention, by which optical imaging systems having a great aperture are emulated, the object is achieved in that one or more intensity-modifying optical elements are provided to vary apodization. In the simplest case, a filter is provided as the intensity-modifying optical element. Even several filters can be provided. The filters may also be exchangeable, so that a different filter can be used or connected depending on the emulated system. For example, the filters can be arranged on a disk and then respectively introduced into the beam path via a user interface.

If the filter is exchangeable, the technical apodization can be emulated for different scanners. The filters can be adapted to different refractive indices of the photoresist to be emulated. Moreover, such a filter can also be designed such that it covers only a numerical aperture which is smaller than the maximum possible numerical aperture. In return, it will then have a higher total transmission. A disadvantage of exchangeable filters is the high mechanical precision required. Thus, the mount must be very precisely engineered. In addition to said attenuation, the absorption layer will also cause a certain phase deviation. In a non-exchangeable filter, such phase deviation has to be compensated for in the filter itself. On the other hand, in a non-exchangeable filter, the phase deviation cannot be automatically removed while the objective is being adjusted.

Therefore, in a preferred embodiment of the invention, the filter is applied directly onto one of the objective lenses. This can be done, for example, by vapor deposition.

In a further preferred embodiment, at least two intensity-modifying optical elements, preferably filters, are provided. One of said elements has a strong intensity-modifying effect and corrects most of the apodization, for example. In this case, the phase deviation is also removed by adjustment. The exchangeable element(s) then also allow(s) adaptation to the particular photoresist being emulated. In this case, the intensity-modifying effect is substantially weaker. Therefore, the phase deviation plays only a secondary role.

Instead of a filter, an intensity-enhancing medium is provided as the intensity-modifying optical element in a preferred embodiment of the invention. Particularly preferably, a laser, in particular a solid state laser which is preferably connectable, is used. Such a laser can be realized, for example, by placing a thin, doped crystal in the pupil plane and pumping it, perpendicular to the optical axis, from at least one side. In order for imaging to take place, the photons have to be superimposed in-phase in the diffraction orders. When the photons pass through the crystal, further photons are stimulated by emission with the correct orientation and in-phase. Which order of diffraction is enhanced to what extent depends on the crystal doping profile and the optical pumping process. The use of an active, intensity-enhancing medium prevents energy losses such as those generated when using filters. However, particularly in microscopes the energy density is already relatively low so that a further reduction by filters might have negative effects in certain circumstances.

Since the beam path in the microscope is usually rotationally symmetric, the intensity-modifying optical element is conveniently embodied such that it modifies intensity substantially with rotation symmetry about the optical axis. Depending on the application, a filter can be embodied such that its transmission either increases or decreases from the center to the periphery. For example, if the emulation in a scanner system is to be emulated, transmission has to increase towards the periphery. In the form which is easiest to realize, the intensity-modifying optical element is conveniently arranged in or near a pupil plane in which the beams coming from an object point are parallel or beams coming from different object points at the same angle converge at the same location. In this manner the natural apodization of a photolithographic scanner can be emulated, for example, if the intensity-modifying optical element is designed to modify intensity substantially according to the following term:

$$I = \frac{C}{\sqrt{1 - \left(\frac{rNA}{r_0 n_r}\right)^2}}$$

wherein I is the transmission of intensity, $r_0$ is the radius of the imaging pupil, r is the distance from the optical axis, $n_r$ is the refractive index in the emulated photoresist, NA is the numerical aperture of the photolithographic scanner, and C is a selectable constant. If a value of 1 is selected as the constant, the intensity-modifying optical element has to enhance intensity. However, if the constant is selected to be less than or equal to the maximum of the term below the fraction bar, the optical element can be designed as purely attenuating—in this case, transmission will not exceed 100%.

In another preferred embodiment of the invention, the intensity-modifying optical element is arranged in an area under high angular load. For example, a filter can be vapor-deposited on a curved lens surface. Transmission through this element will then become angle- and polarization-dependent. A suitable coating allows emulation of Fresnel reflections which appear at the boundary surface at the transition from the air or the immersion liquid to the photoresist. However, there is no restriction to apply the filter to a lens surface. Alternatively, the filter can also be introduced into the beam path at a location where the rays have a high numerical aperture.

When arranging the optical element in an area under high angular load, two major effects can be utilized and the material can be designed accordingly: On the one hand, there is a volume absorption which depends on the angle of incidence and is generated because inclined beams travel longer distances in plane-parallel plates; and, on the other hand, there is a dependence of the reflection at the surface on the angle of incidence of the light. The first effect can also be utilized, of course, in the case of lenses with positive or negative diffraction, where rays entering the lens near the optical axis travel a longer or a shorter distance therein, respectively, than peripheral beams.

Instead of modifications of apodization in the emulation imaging system, one or more intensity-modifying optical elements can also be provided in the beam path of a photolithographic scanner itself, i.e. of the emulated system, so as to vary apodization. In this manner, natural and/or technical apodizations of the scanner system can be corrected such that a correction in the emulation system will become superfluous in certain circumstances. Preferably, the optical element is exchangeably arranged in or near a pupil plane here as well. The optical element conveniently corrects the natural and/or technical apodization according to the photoresist used. In a preferred embodiment of the invention, the optical element has an amplitude transmission T(p, q) with the pupil coordinates (p, q) according to the term $$T(p, q) = \left(\frac{1 - (\beta p)^2 - (\beta q)^2}{1 - \left(\frac{p}{n'}\right)^2 - \left(\frac{q}{n'}\right)^2}\right)^{\frac{1}{4}}$$

wherein β is the magnification and n' is the refractive index of the photoresist used.

The invention will be explained in more detail below with reference to exemplary embodiments.

BRIEF DESCRIPTION OF THE DRAWINGS

In the respective drawings,

FIG. 2 depicts the emulation imaging system, i.e. that part of the mask inspection system—as it currently exists in the prior art—which is located on the image side with respect to the mask;

FIG. 3a depicts a first embodiment of the invention comprising a pupil filter;

FIG. 3b depicts the transmission of the latter for emulation of natural apodization;

DETAILED DESCRIPTION

Figure 1B:
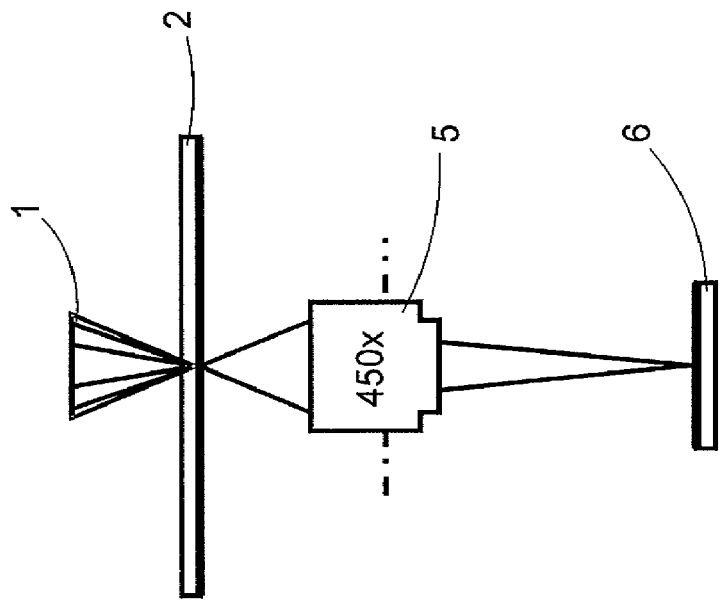
FIG. 1b depicts a prior art mask inspection system.
Figure 1A:
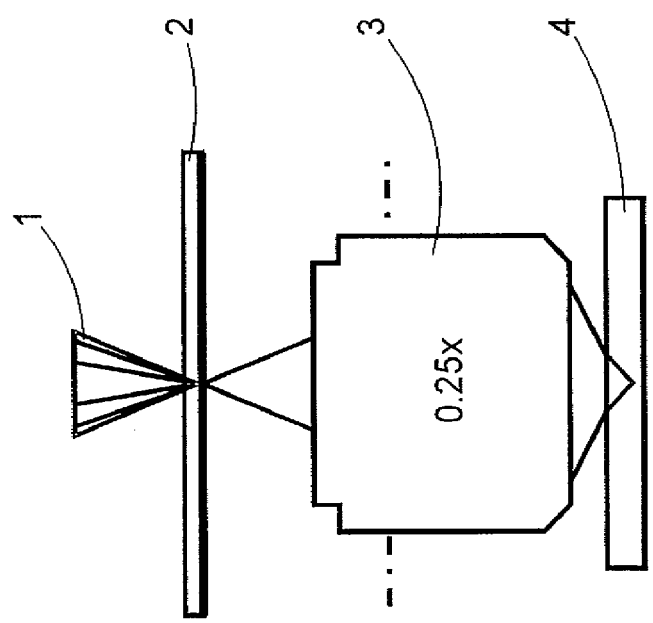
FIG. 1a depicts a photolithographic scanner of the type known from the prior art.

FIG. 1a shows a photolithographic scanner as known from the prior art. Light beams 1 from a source of illumination (not shown) are incident on an object or a mask 2, which is arranged in a field plane. The beams then enter the scanner imaging system 3, which images the mask 2, reduced by a factor of 4 in the example shown here, into a photoresist layer 4 applied onto a wafer. The photoresist is exposed at the light-transmitting locations. By subsequent processing, the image of the mask 2 is reproduced on the wafer.

Since manufacture of the masks is very complex and costly, and since these costs increase as the size of the structures used decreases, the masks are usually tested for errors before being used in photolithographic scanners. For this purpose, the mask inspection system shown by way of example in FIG. 1b, e.g. AIMS™ of Carl Zeiss SMS GmbH, can be used. Up to the dashed line through the imaging system, which line is also indicated in FIG. 1a, both systems are identical, i.e. both systems use the same wavelength, a corresponding source of illumination and the same illumination polarization. The mask-side numerical apertures are also the same. However, whereas the image of the mask 2 is imaged into the photoresist layer 4 with a reduction in size in the scanner imaging system 3, the mask 2 is imaged—in the example shown here—on a CCD camera 6 by the emulation imaging system 5 with a magnification of 450 times chosen as an example here. It goes without saying that other magnifications are also possible. Thus, whereas the numerical aperture is very large on the image side in the case of the scanner, the numerical aperture in the mask inspection system is very small. This difference results in a different apodization.

Said apodization can be compensated for in different ways in the mask inspection system. First of all, FIG. 2 shows the emulation imaging system 5 again in more detail, comprising two lens systems 7 and 8, between which the beams are approximately parallel.

In a first embodiment of the invention, shown in FIG. 3a, a filter 9 is introduced in a pupil plane or a plane near the pupil plane—in this case between the lens systems 7 and 8—which filter modifies transmission of the intensity with rotation symmetry depending on the distance from the optical axis according to the formula $$I = \frac{C}{\sqrt{1 - \left(\frac{rNA}{r_0 n_r}\right)^2}}$$

as shown in FIG. 3b. In this case, the constant C<1 has been selected such that transmission is 100% at the periphery of the pupil. In the example shown, the numerical aperture is 1.4 and the refractive index in the photoresist is 1.72. Instead of the filter, an intensity-enhancing medium can also be employed.

Figure 4:
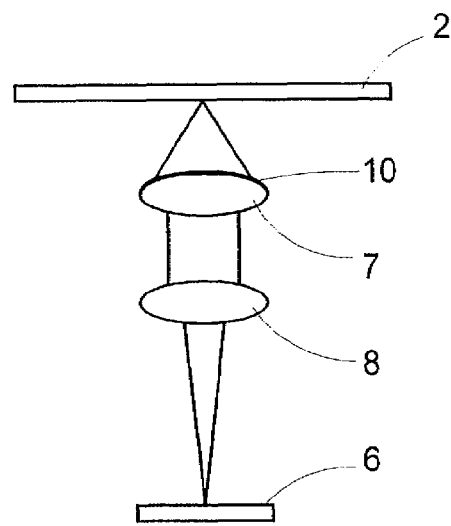
FIG. 4 depicts a further embodiment of the invention, wherein the optical element is arranged in an area under high angular load.
Figure 5:
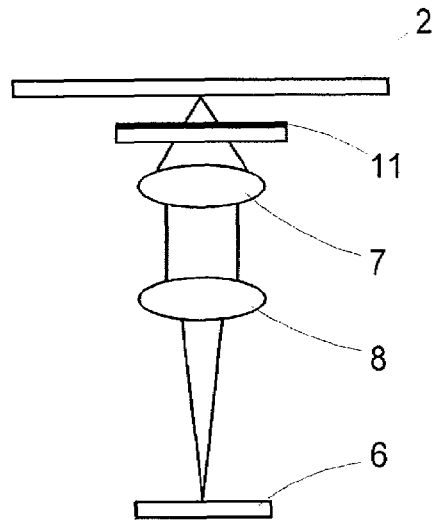
FIG. 5 depicts a further embodiment of the invention, wherein the optical element is also arranged in an area under high angular load.

A second embodiment of the invention is shown in FIG. 4. In this case, the filter 10 was vapor-deposited on a strongly arcuate surface of the lens system 7, which is shown here in a mask-side position. However, it is not limited to this position and may also be situated at other locations. The surface is arcuate and also exhibits a high angular load, i.e. the beams coming from an object point are incident on the filter 10 at large angles. The only decisive factor in selecting a surface is the angular load. As an alternative, a filter 11 having a planar surface can also be inserted between the mask 2 and the lens system 7 or any other position at which there is a large numerical aperture. In both cases, the coating must be selected such that it influences the transmission of the light according to the angle of incidence. For example, a layer can be used whose reflection behavior depends on the angle of incidence of the light.

Figure 6:
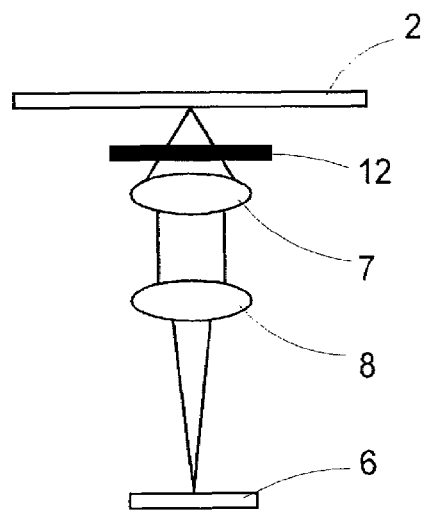
FIG. 6 depicts an alternative to the intensity modification of optical elements in areas under high angular load.

FIG. 6 shows a further embodiment of the invention. Instead of a coating whose filter properties depend on the angle of incidence of the light, a plane-parallel plate 12 is inserted here at the same location—and also under a high angular load—in the beam path between the mask 2 and the lens system 7. This filter element utilizes the effect that beams incident at different angles cover different path lengths in the plate. The greater the angle of incidence is with respect to the surface normal, the greater will be the distance to be covered and the higher will be the absorption in the volume, too.

Figure 7:
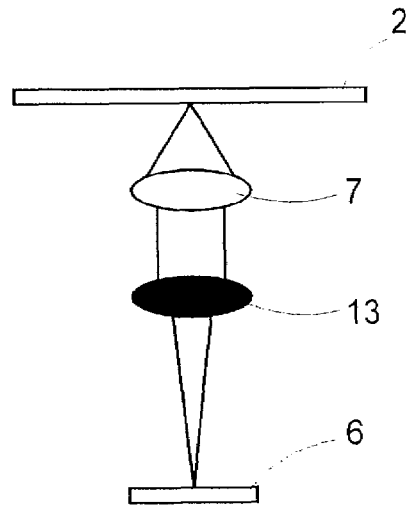
FIG. 7 depicts an embodiment utilizing the different path lengths covered in one of the lenses.

Alternatively, as shown in FIG. 7, a lens 13—of the lens system 8 in this example—can also be used for volume absorption. As in the case of the above-mentioned plate 12, advantage is taken here also of the effect of the different path lengths and of the related differences in absorption. However, the lens can also be inserted at a position in the system where beam divergence is low or even approaches zero. The different path lengths are then due to the shape of the lens. For example, in a convex lens having positive refraction the beams impinging on the lens near the optical axis cover a greater distance in said lens than beams impinging on the lens at the periphery of the lens. For concave lenses having negative refraction the exact opposite is the case.

The intensity-modifying optical elements, which have been considered here as examples of the emulation imaging system in the mask inspection system, can be used with comparable properties in a similar manner at basically the same locations in the scanner imaging system 3.

Figure 8:
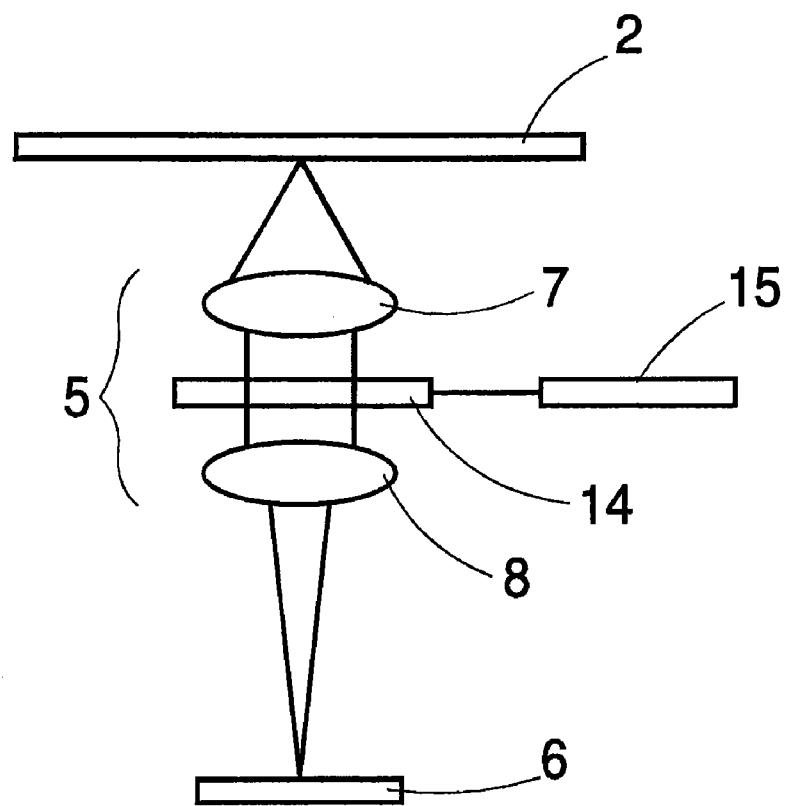
FIG. 8 depicts an emulation imaging system according to another embodiment of the invention.

As a rule, intensity-attenuating elements, such as filters, will be used to modify intensity. However, an embodiment of the method is also conceivable wherein intensity is enhanced by the intensity-modifying optical element depicted in FIG. 8.

If a photolithographic scanner is emulated, the intensity distribution will be advantageously predetermined as a function of the numerical aperture of the scanner and of the emulated photoresist.

Figure 9:
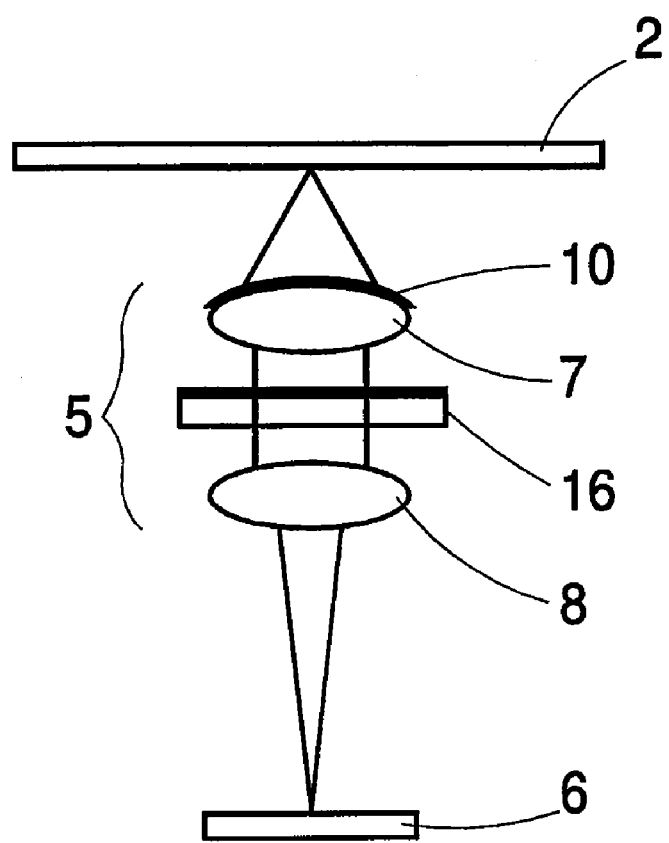
FIG. 9 depicts another emulation imaging system according to another embodiment of the invention.

Further, in microscopic imaging systems for carrying out the method by which optical imaging systems having a great aperture are emulated, the object is achieved in that one or more intensity-modifying optical elements are provided to vary apodization. In the simplest case, a filter 9, 10, 11, 16 is provided as the intensity-modifying optical element. Even several filters 9, 10, 11, 16 can be provided. The filters 16 may also be exchangeable as depicted in FIG. 9, so that a different filter 16 can be used or connected depending on the emulated system. For example, the filters 16 can be arranged on a disk and then respectively introduced into the beam path via a user interface.

If the filter 16 is exchangeable, the technical apodization can be emulated for different scanners. The filters 9, 10, 11, 16 can be adapted to different refractive indices of the photoresist to be emulated. Moreover, such a filter 9, 10, 11, 16 can also be designed such that it covers only a numerical aperture which is smaller than the maximum possible numerical aperture. In return, it will then have a higher total transmission. A disadvantage of exchangeable filters 16 is the high mechanical precision required. Thus, the mount must be very precisely engineered. In addition to said attenuation, the absorption layer will also cause a certain phase deviation. In a non-exchangeable filter 9, 10, 11, such phase deviation has to be compensated for in the filter itself. On the other hand, in a non-exchangeable filter 16, the phase deviation cannot be automatically removed while the objective is being adjusted.

Therefore, in a preferred embodiment of the invention, the filter 10 is applied directly onto one of the objective lenses. This can be done, for example, by vapor deposition.

In a further preferred embodiment, at least two intensity-modifying optical elements, preferably filters 9, 10, 11, 16, are provided. One of said elements has a strong intensity-modifying effect and corrects most of the apodization, for example. In this case, the phase deviation is also removed by adjustment. The exchangeable element(s) then also allow(s) adaptation to the particular photoresist being emulated. In this case, the intensity-modifying effect is substantially weaker. Therefore, the phase deviation plays only a secondary role.

Instead of a filter 9, 10, 11, 16, an intensity-enhancing medium is provided as the intensity-modifying optical element in a preferred embodiment of the invention. Particularly preferably, a laser 15, in particular a solid state laser which is preferably connectable, is used. Such a laser 15 can be realized, for example, by placing a thin, doped crystal 14 in the pupil plane and pumping it, perpendicular to the optical axis, from at least one side. In order for imaging to take place, the photons have to be superimposed in-phase in the diffraction orders. When the photons pass through the crystal, further photons are stimulated by emission with the correct orientation and in-phase. Which order of diffraction is enhanced to what extent depends on the crystal doping profile and the optical pumping process. The use of an active, intensity-enhancing medium prevents energy losses such as those generated when using filters. However, particularly in microscopes the energy density is already relatively low so that a further reduction by filters might have negative effects in certain circumstances.

LIST OF REFERENCE SYMBOLS

1 Light beam
2 Mask
3 Scanner imaging system
4 Photoresist layer
5 Emulation imaging system
6 CCD camera
7, 8 Lens system
9, 10, 11 Filter
12 Plane-parallel plate
13 Lens

The invention claimed is:

1. A method for determining intensity distribution in the image plane of a projection exposure system, comprising:
arranging and exposing a mask;
directing light which comes from the mask onto a spatially resolving detector;
recording a signal by the spatially resolving detector;
computing intensity distribution on the basis of said signal;
determining a complex amplitude distribution in the exit pupil;
combining the amplitude distribution with a predetermined apodization correction; and
computing an image exhibiting a corrected apodization on the basis of the modified amplitude distribution;
wherein the computation takes the numerical aperture in the image plane of the projection exposure system into consideration.

2. The method as claimed in claim 1, further comprising determining the intensity distribution in the image plane of the projection exposure system;
combining the intensity distribution with a predetermined intensity correction; and
computing a correct image on the basis of the modified intensity distribution.

3. The method as claimed in claim 1, further comprising determining the phase distribution of the incident light in order to determine the complex amplitude distribution in the exit pupil; and
reconstructing the complex amplitude distribution based on the phase distribution.

4. The method as claimed in claim 1, further comprising determining the complex amplitude distribution for a number of points having the coordinates (p,q) in the exit pupil; and
combining the complex amplitude distribution with the apodization correction.

5. The method as claimed in claim 1, wherein the predetermined apodization correction substantially corresponds to apodization present in an emulation imaging system, and the amplitude distribution is divided by the predetermined apodization correction, so that the apodization present in the emulation imaging system is compensated for at least in part by said combination.

6. The method as claimed in claim 5, wherein the natural and/or technical apodization of the emulation imaging system are predetermined for apodization correction.

7. The method as claimed in claim 1, wherein the predetermined apodization correction substantially corresponds to apodization present in an emulated imaging system, and the amplitude distribution is multiplied by the predetermined apodization correction, so that the apodization present in the emulated imaging system is generated at least approximately.

8. The method as claimed in claim 7, further comprising predetermining the natural and/or technical apodization of the emulated imaging system for apodization correction.

9. The method as claimed in claim 8, wherein a photolithographic scanner is emulated, and further comprising predetermining the apodization correction according to the numerical aperture of the photolithographic scanner and the emulated photoresist.

10. The method as claimed in claim 9, wherein the natural apodization $T(p,q)$ of the photolithographic scanner is determined according to the term $$T(p, q) = \left( \frac{1}{1 - \left(\frac{p}{n'}\right)^2 - \left(\frac{q}{n'}\right)^2} \right)^{\frac{1}{4}}$$

wherein T is the amplitude transmission, p and q are the dimension-less pupil coordinates and n' is the refractive index of the photoresist used.

11. A microscopic imaging system comprising one or more intensity-modifying optical elements to vary apodization
wherein at least one of the one or more intensity-modifying optical elements is designed to modify intensity substantially according to the term $$I = \frac{C}{\sqrt{1 - \left(\frac{rNA}{r_0 n_r}\right)^2}}$$

wherein I is the transmission of intensity, $r_0$ is the radius of the imaging pupil, r is the distance from the optical axis, $n_r$ is the refractive index in the emulated photoresist, NA is the numerical aperture of the photolithographic scanner and C is a constant.

12. A microscopic imaging system as claimed in claim 11, wherein the intensity-modifying optical element comprises a filter.

13. The microscopic imaging system as claimed in claim 11, wherein the intensity-modifying optical element is applied onto a lens.

14. The microscopic imaging system as claimed in claim 11, wherein the intensity-modifying optical element comprises an intensity-enhancing medium.

15. The microscopic imaging system as claimed in claim 14, wherein the intensity-modifying medium comprises a laser.

16. The microscopic imaging system as claimed in claim 15, wherein the laser comprises a solid state laser which is pumped from at least one side perpendicular to the optical axis.

17. The microscopic imaging system as claimed in claim 11, wherein at least one of the one or more intensity-modifying optical elements is connectable or exchangeable.

18. The microscopic imaging system as claimed in claim 11, wherein the one or more intensity-modifying optical elements comprise one permanently installed intensity-modifying optical element and at least one further, exchangeable intensity-modifying optical element and wherein the permanently installed intensity-modifying optical element modifies intensity more strongly than the exchangeable intensity-modifying optical element.

19. The microscopic imaging system as claimed in claim 11 wherein the intensity-modifying optical element is designed to modify intensity substantially with rotational symmetry about an optical axis.

20. The microscopic imaging system as claimed in claim 11, wherein the intensity-modifying optical element is arranged in or near a pupil plane.

21. The microscopic imaging system as claimed in claim 11, wherein the intensity-modifying optical element is arranged in an area under high angular load and the transmission through the intensity-modifying optical element depends on the angle of incidence of light.

22. The microscopic imaging system as claimed in claim 11, wherein the intensity-modifying optical element has a transmission which increases as distance from an optical axis increases.

23. A photolithographic scanner, comprising:
one or more intensity-modifying optical elements in the beam path so as to vary apodization;
wherein at least one of the one or more intensity-modifying optical elements has an amplitude transmission T(p,q) with the pupil coordinates (p,q) according to the term $$T(p, q) = \left( \frac{1 - (\beta p)^2 - (\beta q)^2}{1 - \left(\frac{p}{n'}\right)^2 - \left(\frac{q}{n'}\right)^2} \right)^{\frac{1}{4}}$$

wherein $\beta$ is the magnification and n' is a refractive index of a photoresist used.

24. The photolithographic scanner as claimed in claim 23, wherein the intensity-modifying optical element corrects a natural and/or technical apodization according to a photoresist used.

25. A method for determining intensity distribution in the image plane of a projection exposure system, comprising:
arranging and exposing a mask;
directing light which comes from the mask onto a spatially resolving detector;
recording a signal by the spatially resolving detector;
computing intensity distribution on the basis of said signal;
wherein the computation takes the numerical aperture in the image plane of the projection exposure system into consideration; and
further wherein a predetermined apodization correction substantially corresponds to apodization present in an emulated imaging system, and an amplitude distribution is multiplied by the predetermined apodization correction, so that the apodization present in the emulated imaging system is generated at least approximately.

* * * * *

UNITED STATES PATENT AND TRADEMARK OFFICE
CERTIFICATE OF CORRECTION

| | | |
|---|---|---|
| PATENT NO. | : 7,961,297 B2 | Page 1 of 1 |
| APPLICATION NO. | : 12/065451 | |
| DATED | : June 14, 2011 | |
| INVENTOR(S) | : Joern Greif-Wuestenbecker et al. | |

It is certified that error appears in the above-identified patent and that said Letters Patent is hereby corrected as shown below:

Title Page Item [86] PCT Pub. No. is missing 'A1' at its end.

Title Page Item [30] Foreign Application Priority Data is missing '.1' after the last three digits "496".

Col. 2, line 45 "in front of within and behind" should be 'in front of, within and behind'.

Signed and Sealed this
Twenty-seventh Day of September, 2011

David J. Kappos
*Director of the United States Patent and Trademark Office*